United States Patent
Lee

(10) Patent No.: US 7,301,234 B2
(45) Date of Patent: Nov. 27, 2007

(54) STACK TYPE SEMICONDUCTOR PACKAGE MODULE UTILIZING SOLDER COATED STACKING PROTRUSIONS AND METHOD FOR MANUFACTURING THE SAME

(75) Inventor: Dae Woong Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 34 days.

(21) Appl. No.: 11/304,047

(22) Filed: Dec. 15, 2005

(65) Prior Publication Data
US 2007/0090498 A1    Apr. 26, 2007

(30) Foreign Application Priority Data
Sep. 7, 2005    (KR)    ..................... 10-2005-0083238

(51) Int. Cl.
*H01L 23/34*    (2006.01)
(52) U.S. Cl. .................. 257/723; 257/286; 257/697
(58) Field of Classification Search ................ 257/723, 257/697, 737, 686
See application file for complete search history.

(56) References Cited

U.S. PATENT DOCUMENTS

| | | | |
|---|---|---|---|
| 6,013,948 A * | 1/2000 | Akram et al. | 257/698 |
| 6,020,629 A * | 2/2000 | Farnworth et al. | 257/686 |
| 7,132,311 B2 * | 11/2006 | Akiba et al. | 438/109 |

* cited by examiner

*Primary Examiner*—Roy Karl Potter
(74) *Attorney, Agent, or Firm*—Ladas & Parry LLP

(57) ABSTRACT

The stack type semiconductor package module includes a lower semiconductor package having a main substrate, a chip mounted on the main substrate and electrically connected to the main substrate through a wire. An epoxy molding compound (EMC) is provided on the main substrate to cover the chip and the wire. Contact holes are formed in the EMC. A sub-substrate having protrusions coated with solder is connected to the lower semiconductor package by inserting the solder coated protrusions into the contact holes. Heat is applied to the protrusions, and the molten solder solidifies inside the contact holes. An upper semiconductor package having substantially identical structure as the lower package is then stacked on the sub-substrate.

5 Claims, 6 Drawing Sheets

STACK TYPE SEMICONDUCTOR PACKAGE MODULE UTILIZING SOLDER COATED STACKING PROTRUSIONS AND METHOD FOR MANUFACTURING THE SAME

BACKGROUND OF THE INVENTION

1. Field of the invention The present invention relates generally to a stack type semiconductor package module. More particularly, the present invention relates to a stack type semiconductor package module including a ball layer having a simple structure for high integration.

2. Description of the Prior Art

Recently, there exist various demands for improved semiconductor fabrication technology in the areas such as lightness, compactness, multi-functions, high-performance and low fabrication costs. The semiconductor packaging technology has been developed in response to such various demands put on the semiconductor fabrication technology. FIG. 1 shows a conventional stack type semiconductor package module 10 including a plurality of stacked semiconductor packages 20.

However, according to the conventional stacked type semiconductor package module 10, the semiconductor packages 20 must be bonded to a ball layer 30 after the semiconductor packages 20 have been stacked, so that not only the increased height of the conventional semiconductor package module 10 is undesirable, but also the structure of the semiconductor package module 10 is complicated.

SUMMARY OF THE INVENTION

Accordingly, the present invention has been made to solve the above-mentioned problems occurring in the prior art, and an object of the present invention is to provide a stack type semiconductor package module capable of reducing a height while simplifying a structure thereof.

In order to accomplish the above object, according to one aspect of the present invention, there is provided a stack type semiconductor package module comprising: a lower semiconductor package including a main substrate, a chip mounted on a first surface of the main substrate and electrically connected to the main substrate through a wire, an epoxy molding compound (EMC) applied to the first surface of the main substrate to cover the chip and the wire, a plurality of contact holes formed at both lateral ends of the EMC, and a plurality of solder balls provided at a second surface of the main substrate; a sub-substrate provided at both lateral ends of a second surface thereof with a plurality of protrusions inserted into the contact holes of the lower semiconductor package; and an upper semiconductor package stacked on a first surface of the sub-substrate and having a structure identical to that of the lower semiconductor package.

According to the preferred embodiment of the present invention, a solder is coated on outer peripheral portions of the protrusions, and the solder is melted as heat is applied thereto, thereby bonding the protrusions to the main substrate of the lower semiconductor package and the contact holes.

Preferably, the protrusions are made from electrically and thermally conductive materials.

Preferably, the electrically and thermally conductive materials include copper.

Preferably, a space section formed between the sub-substrate and the upper semiconductor package is under-filled with liquid-phase resin materials.

According to another aspect of the present invention, there is provided a method for manufacturing a stack type semiconductor package module, the method comprising the steps of: preparing a lower semiconductor package including a main substrate, a chip mounted on a first surface of the main substrate, an epoxy molding compound (EMC) applied to the first surface of the main substrate to cover the chip and formed at both lateral ends thereof with a plurality of contact holes, and a plurality of solder balls provided at a second surface of the main substrate; preparing a sub-substrate provided at a second surface thereof with a plurality of protrusions, in which a solder is coated on outer peripheral portions of the protrusions, and inserting the protrusions into the contact holes of the lower semiconductor package; melting the solder coated on the outer peripheral portions of the protrusions by heating the sub-substrate coupled with the lower semiconductor package, thereby bonding the protrusions to the main substrate of the lower semiconductor package and the contact holes; and stacking an upper semiconductor package having a structure identical to that of the lower semiconductor, package on a first surface of the sub-substrate bonded to the lower semiconductor package.

According to the preferred embodiment of the present invention, the method further comprises a step of forming an under-fill layer made from a liquid-phase resin material between the sub-substrate and the upper semiconductor package.

Preferably, the solder is melted by means of four heaters, which are aligned corresponding to upper and lower end portions of the contact holes.

BRIEF DESCRIPTION OF THE DRAWINGS

The above and other objects, features, and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described in detail with reference to accompanying drawings.

Figure 2:
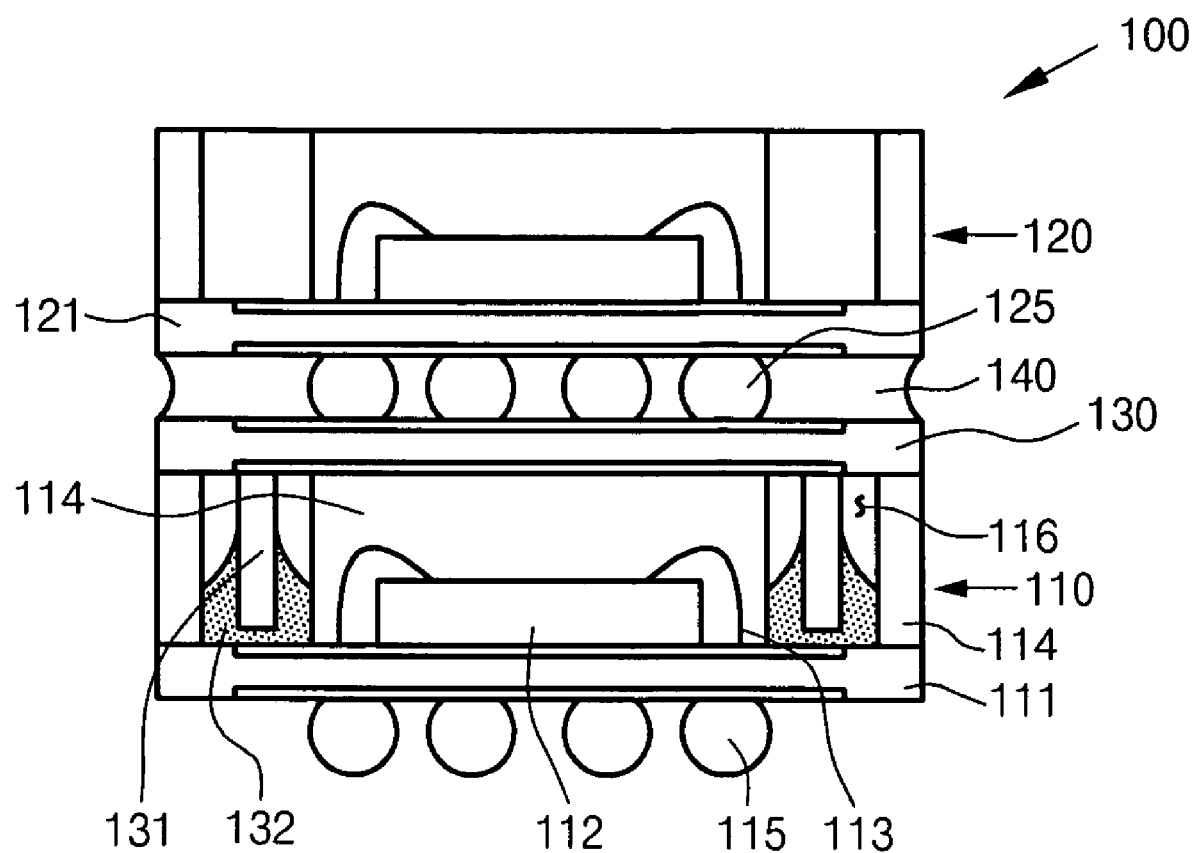
FIG. 2 is a cross-sectional view for illustrating a stack type semiconductor package module according to one embodiment of the present invention.
Figure 3:
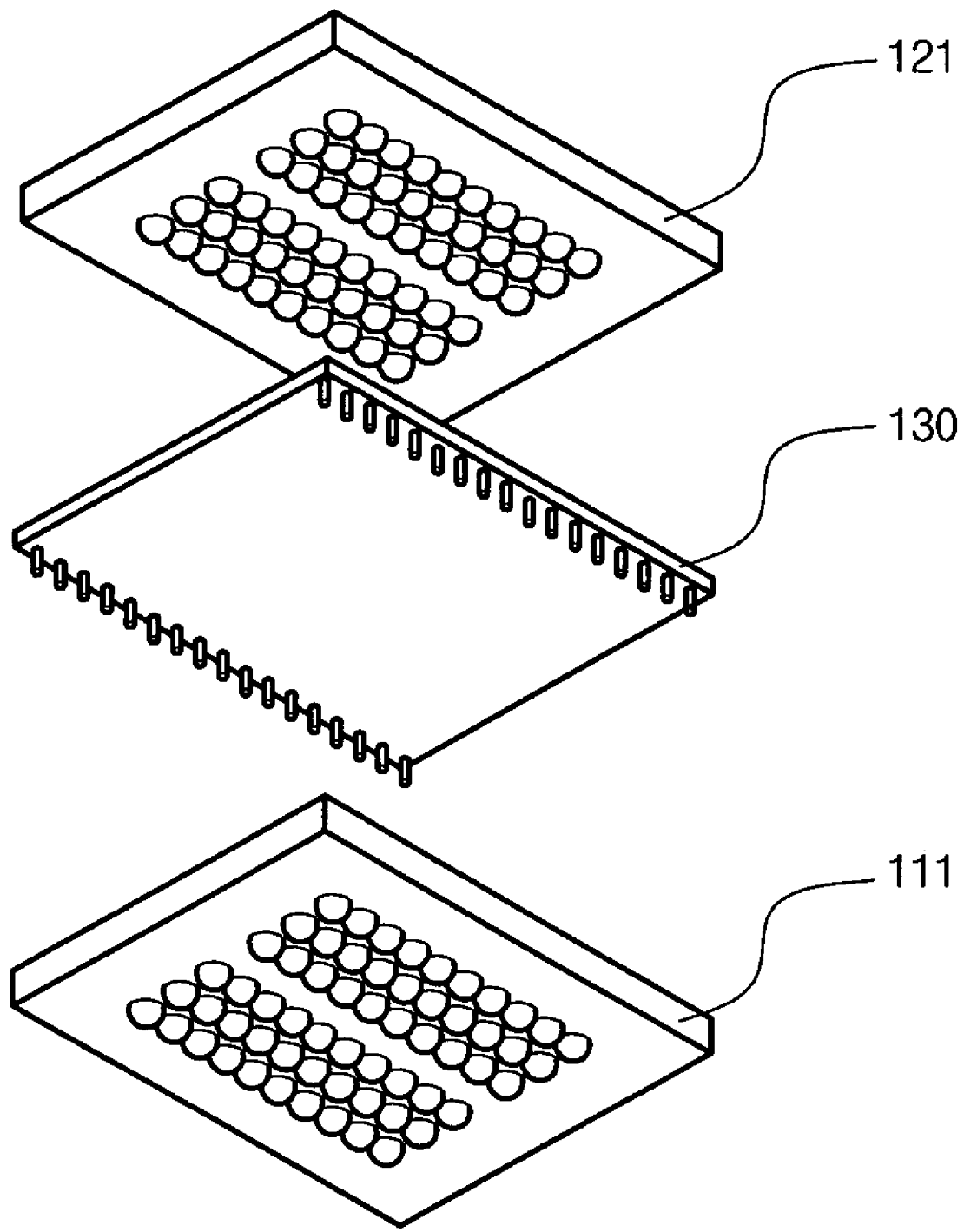
FIG. 3 is an exploded perspective view of a stack type semiconductor package module shown in FIG. 2 according to an embodiment of the present invention.

FIG. 2 is a cross-sectional view for illustrating a stack type semiconductor package module according to one embodiment of the present invention, and FIG. 3 is an exploded perspective view of the stack type semiconductor package module shown in FIG. 2.

Referring to FIGS. 2 and 3, the stack type semiconductor package module 100 includes a lower semiconductor package 110, an upper semiconductor package 120, and a sub-substrate 130 interposed between the lower and upper semiconductor packages 110 and 120.

The lower semiconductor package 110 includes a lower main substrate 111, a lower chip 112 mounted on one surface of the lower main substrate 111, a lower wire 113 for electrically connecting the lower main substrate 111 with the lower chip 112, an epoxy molding compound (EMC) 114 applied to the lower main substrate 111 to cover and protect the chip 112 and the lower wire 113 from external negative impact, and a plurality of solder balls 115 provided at the other surface of the lower main substrate 111.

Herein, a plurality of lower contact holes 116 are formed at both lateral ends of the EMC 114 covering the lower chip 112 so as to allow the sub-substrate 130 having a plurality of protrusions 131 to be respectively coupled inside the plurality of the lower contact holes 116. Herein, the lower main substrate 111 and the protrusions 131 are connected electrically by solder 132 which secures the protrusions 131 in the contact hole 116.

The upper semiconductor package 120 has the structure identical or substantially similar to that of the lower semiconductor package 110, so the description thereof will be omitted. As shown in FIG. 2, a plurality of upper solder balls 125 are formed on the lower surface of the upper main substrate 121, which has identical or substantially similar structure of the lower main substrate 111 and the lower solder balls 115. The upper solder balls 125 then contact the sub-substrate 130 through the underfill layer 140.

The plurality of protrusions 131 are provided on one surface of the sub-substrate 130 that is facing the lower semiconductor package 110. The protrusions 131 are made from materials having electric and/or thermal conductivity such as copper. In addition, a solder 132, which is a thermally fusible material, is coated on outer peripheral portions of the protrusions 131. The solder coated on each protrusion 131 is then melted in a later process, which is described in detail below, to form the solder structure 132 as shown in FIG. 2 connecting and securing the protrusion 131 to the epoxy molding compound 114 and the lower main substrate 111 surrounding the contact hole 116 that particular protrusion 131 is coupled in.

FIG. 3 is an exploded perspective view of a stack type semiconductor package module shown in FIG. 2, with an exception that in FIG. 3 the plurality of protrusions 131 is formed in two rows. It should be readily understood that the present invention is not limited to a single of protrusions 131 formed FIG. 3 shows in a perspective view the lower main substrate 111, the sub-substrate 130, and the upper main substrate 121.

FIGS. 4A to 4F are cross-sectional views for illustrating the procedure for manufacturing the stack type semiconductor package module 100 including the lower semiconductor package 110, the upper semiconductor package 120, and the sub-substrate 130.

Figure 4A:
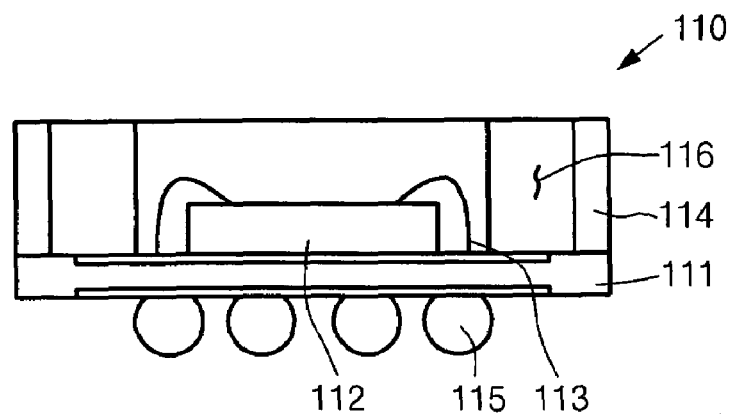
FIGS. 4A to 4F are cross-sectional views illustrating the procedure for manufacturing a stack type semiconductor package module as shown in FIG. 2 according to an embodiment of the present invention.

Referring to FIG. 4A, the lower semiconductor package 110 is first prepared as shown in FIG. 4A. The lower semiconductor package 110 shown in FIG. 4 is same as the lower semiconductor package 110 shown in FIG. 2; thus, the description about the structure of the package 110 shown in FIG. 4 is not repeated.

Figure 4B:
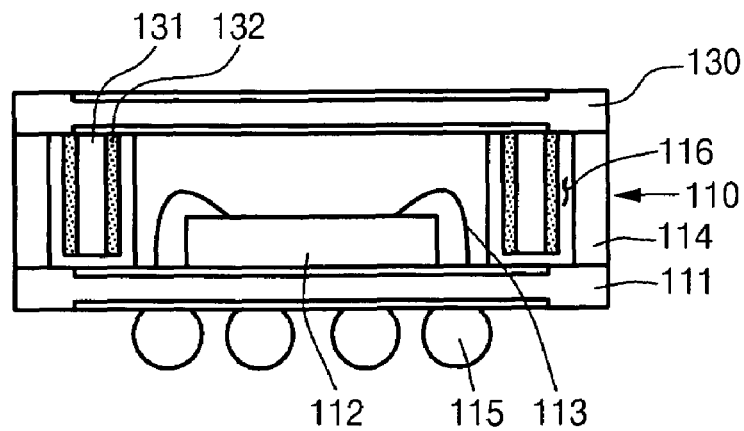

Then, now referring to FIG. 4B, the sub-substrate 130 having a plurality of protrusions 131 is provided such that each protrusion of the sub-substrate 130 are inserted into the respective one of the contact holes 116. The sub-substrate 130 is then considered to be coupled with the lower semiconductor package 110 as shown in FIG. 4B. Each of the protrusions 131 is coated with solder 132.

Figure 4C:
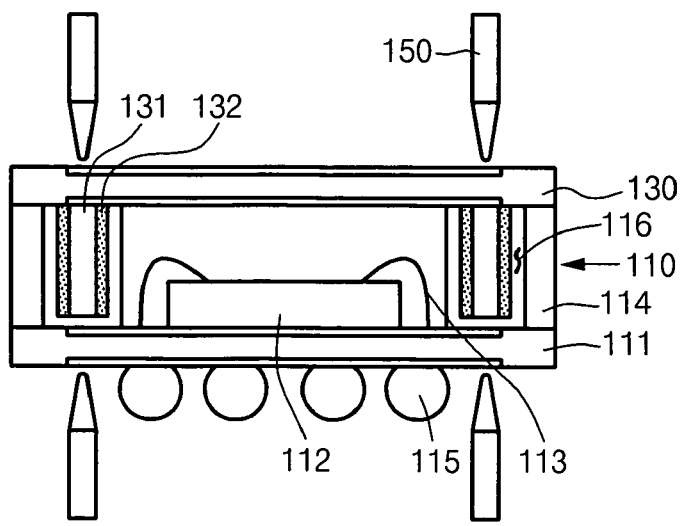

After that, as shown in FIG. 4C, heat is applied to the upper portion of the sub-substrate 130 and the lower portion of the lower main substrate 111 by means of heaters 150. The heaters 150 will melt the solder 132 coated on the outer peripheral portions of the protrusions 131. As shown in FIG. 4, four heaters 150 are preferably provided such that each heater correspond to one of the upper or lower end portions of the contact holes 116 in order to melt the solder 132 in each contact hole 116. In addition, if the protrusions 131 are made from copper having superior heat conductivity, the solder 132 coated at the outer peripheral portions of the protrusions 131 can be easily melted.

Figure 4D:
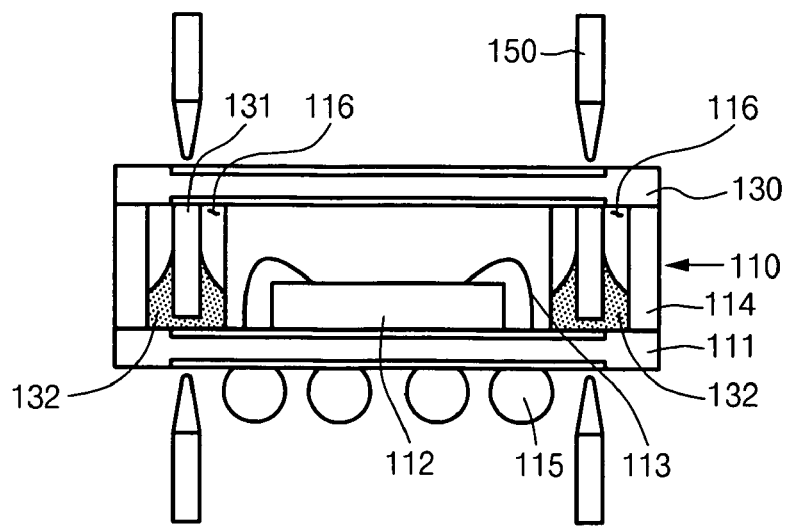

Then, as shown in FIG. 4D, the melted solder 132 flows downward inside the contact holes 116 and sticks to both the surface of the lower main substrate 111 and the lower sidewalls of the contact holes 116 and solidifies into a solid phase. This bonds the lower semiconductor package 110 to the sub-substrate 130.

Figure 4E:
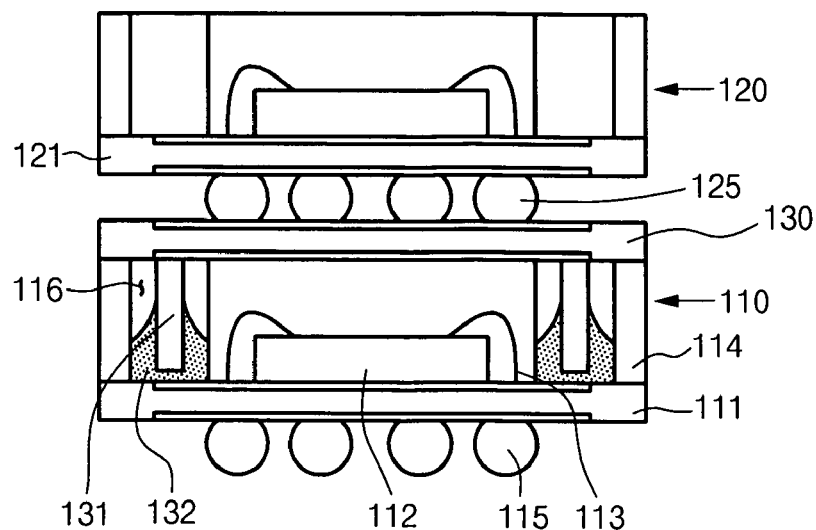

As shown in FIG. 4E, the upper semiconductor package 120 is stacked on the sub-substrate 130, in such a manner that the solder balls 125 of the upper semiconductor package 120 makes contact with the upper surface of the sub-substrate 130.

Figure 4F:
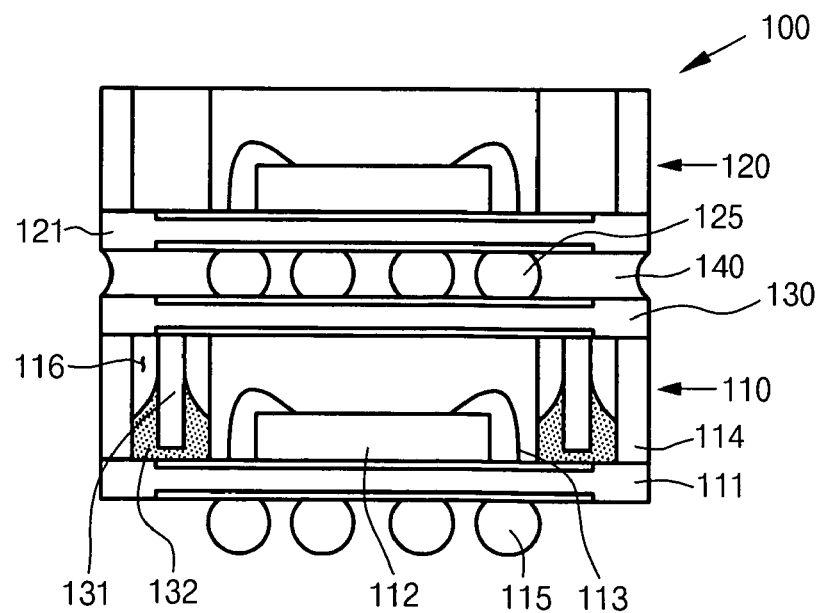

After that, as shown in FIG. 4F, the space formed by the solder balls 125 between the upper main substrate 121 and the sub-substrate 130 is under-filled with liquid-phase crystal resin materials to form an under-fill layer 140 in the space. The fabrication of the stack type semiconductor package module 100 having two layers of packages 110, 120 is completed. More layers can be stacked on the package 120 by repeating the same process described above. Although the present invention has been described in relation to the stack type semiconductor package module 100 having the two-layer structure consisting of the lower and upper semiconductor packages 110 and 120, the present invention is not limited to just two layers. A plurality of semiconductor packages can be stacked through the above procedure.

Figure 1:
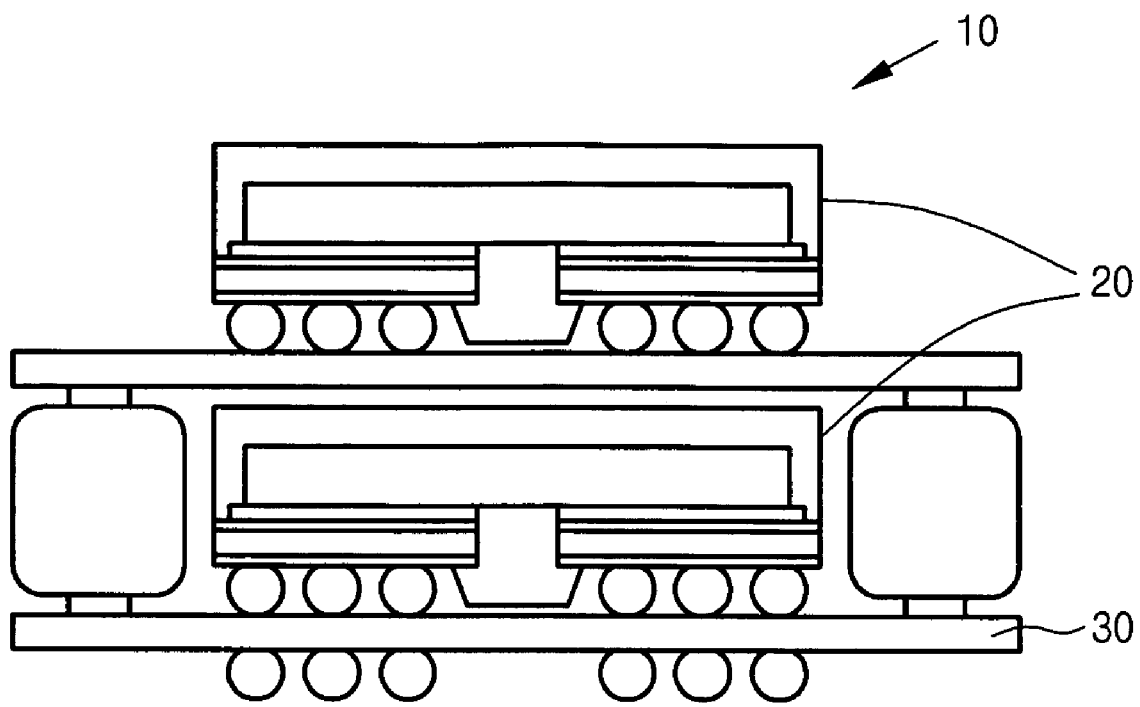
FIG. 1 is a cross-sectional view for illustrating a conventional stack type semiconductor package module.

According to the stack type semiconductor package module having the above structure and the method of manufacturing the same, it is possible to simplify the structure of the stack type semiconductor package module while reducing the height of the stack type semiconductor package module. That is, in the stack type semiconductor package module 100 of the present invention, the lower package 110 and the sub-substrate 130 are contacted each other without waste space. Therefore, the height average of the stack type semiconductor package module 100 of the present invention is smaller than that of the conventional stack type semiconductor package module 10 which has waste space between the lower package 20 and the upper ball layer 30 as shown in FIG. 1.

As described above, according to the stack type semiconductor package module (such as 100) and the method for manufacturing the same of the present invention, the sub-substrate (such as 130) is interposed between the stacked semiconductor packages (such as 110, 120) so that the height of the stack type semiconductor package module can be reduced and the structure of the stack type semiconductor package module can be simplified.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A stack type semiconductor package module comprising:
   a lower semiconductor package comprising:
      a lower main substrate;
      a chip mounted on a first surface of the lower main substrate and electrically connected to the lower main substrate through a wire;

an epoxy molding compound (EMC) applied to the first surface of the lower main substrate to cover at least the chip and the wire;
a plurality of contact holes formed at predetermined positions of the EMC; and
a plurality of solder balls provided at a second surface of the lower main substrate;
a sub-substrate having a plurality of protrusions formed on a second surface at positions corresponding to the positions of the contact holes formed in the EMC,
wherein the each of the protrusions is inserted into respective one of the contact holes formed in the EMC of the lower semiconductor package and is electrically connected to the lower semiconductor package by solder formed in the contact hole; and
an upper semiconductor package stacked on a first surface of the sub-substrate and having a structure identical to that of the lower semiconductor package.

2. The stack type semiconductor package module as claimed in claim 1, wherein the solder is coated on the protrusions, and, after the protrusions are inserted into the contact holes, the solder is melted by heat to bond the protrusions to the lower main substrate of the lower semiconductor package and to sidewalls of the contact holes.

3. The stack type semiconductor package module as claimed in claim 1, wherein the protrusions are made from electrically or thermally conductive materials.

4. The stack type semiconductor package module as claimed in claim 3, wherein the electrically or thermally conductive materials include copper.

5. The stack type semiconductor package module as claimed in claim 1, wherein any space between the sub-substrate and the upper semiconductor package is under-filled with liquid-phase resin materials.

* * * * *